United States Patent [19]
Daoud

[11] Patent Number: 6,036,040
[45] Date of Patent: *Mar. 14, 2000

[54] POSITIVE-RETENTION WIRE TROUGH FOR ELECTRICAL EQUIPMENT

[75] Inventor: Bassel H. Daoud, Parsippany, N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 09/167,378

[22] Filed: Oct. 6, 1998

[51] Int. Cl.$^7$ ....................................................... B65D 6/28
[52] U.S. Cl. ........................................... 220/3.94; 220/4.02
[58] Field of Search .................................. 220/4.02, 3.94, 220/3.8, 3.92, 3.9, 3.2, 3.3, 3.4, 345.2, 345.3, 348

[56] References Cited

U.S. PATENT DOCUMENTS

| | | | |
|---|---|---|---|
| 2,000,850 | 5/1935 | Knell | 220/3.2 |
| 3,024,937 | 3/1962 | Kooi | 220/3.92 |
| 3,701,837 | 10/1972 | Fork | 174/50 |
| 4,706,808 | 11/1987 | Guetersoh | 206/305 |
| 4,733,330 | 3/1988 | Tanaka et al. | 361/641 |
| 5,409,107 | 4/1995 | Browne | 206/305 |
| 5,431,572 | 7/1995 | Surrey et al. | 439/134 |
| 5,731,544 | 3/1998 | Burck et al. | 174/66 |
| 5,892,659 | 4/1999 | Cooper et al. | 361/727 |

*Primary Examiner*—Stephen Castellano

[57] ABSTRACT

A wire trough for an enclosure for telecommunications or other electrical equipment (such as a building entrance protector) has a latch that is disengaged by the application of a force between the wire trough and the enclosure to remove the wire trough from its full mounting position within a corresponding mounting channel within the enclosure wall. The latch prevents inadvertent removal of the wire trough from within the mounting channel, which, for example, might otherwise result from applying tension to wires retained within the wire trough. In one embodiment, the wire trough and mounting channel have, along each lateral edge, a tongue and a groove that engage one another to guide the wire trough into the mounting channel. In addition, the wire trough and mounting channels may have male and female dimples that help retain the wire trough within the mounting channel at the full mounting position.

22 Claims, 6 Drawing Sheets

6,036,040

POSITIVE-RETENTION WIRE TROUGH FOR ELECTRICAL EQUIPMENT

BACKGROUND OF THE INVENTION

1. Field of the Invention

The present invention relates to telecommunications equipment, and, in particular, to enclosures for housing and protecting telecommunications equipment.

2. Description of the Related Art

A building entrance protector (BEP) is an enclosure used to house and protect telecommunications equipment. For example, a BEP may house the components used to interface between a multi-wire cable providing telephone service to a building and the twisted pairs of copper wire for individual telephones distributed throughout the building. These interface components may include splicing connectors used to break out pairs of wires from a multi-wire cable, as well as electrical isolation interface components, such as protector panels used to receive high-voltage/high-current plug-in protectors, and connectors, such as insulation displacement connectors (IDCs), used to terminate twisted pairs from individual telephones. The BEP may have two or more hinged pieces that define one or more different compartments within the BEP for such functions as breaking out twisted pairs of wires from the multi-wire cable, connecting the twisted pairs to electrical isolation components, connecting the electrical isolation components to IDC connectors, and terminating twisted pairs at the IDC connectors.

FIG. 1A shows a conventional building entrance protector 100, which is adapted to be configured with a number of wire troughs, such as wire trough 102 shown in FIG. 1B. Wire trough 102, which can be mounted within a channel 104 in a wall of BEP 100, is used to retain in an orderly manner wires connecting electrical hardware inside BEP 100 to external electrical hardware. For example, twisted pairs from telephones may be retained by wire troughs 102 for termination at IDC connectors within BEP 100. Such wire troughs help prevent crimping or "guillotining" of the wires when the lid of BEP 100 is closed. Unfortunately, if certain tension is applied to the wires while the lid of BEP 100 is open, the wire trough may be inadvertently removed from its position within the wall channel. In addition to being a nuisance to the person working on equipment within BEP 100, this can result in damage to the wires themselves, which may require costly and inefficient re-wiring of components.

SUMMARY OF THE INVENTION

The present invention is directed to a positive-retention wire trough for building entrance protectors, such as BEP 100 of FIG. 1, and other wiring boxes for telecommunications and other electrical equipment. According to embodiments of the present invention, the wire trough has a special latch that prevents inadvertent removal of the wire trough from within a wall channel, e.g., when tension is applied to the wires retained by the wire trough.

In one embodiment, the present invention is a wire trough for an enclosure for electrical equipment. The wire trough comprises one half of a latch adapted to engage a corresponding half of the latch that is part of a mounting channel of a wall of the enclosure. The latch is adapted to be disengaged by the application of a force between the wire trough and the enclosure in order to remove the wire trough from a full mounting position within the mounting channel.

In an alternative embodiment, the present invention is an enclosure for electrical equipment, the enclosure having at least one wire trough, each wire trough comprising one half of a latch adapted to engage a corresponding half of the latch that is part of a mounting channel of a wall of the enclosure. The latch is adapted to be disengaged by the application of a force between the wire trough and the enclosure in order to remove the wire trough from a full mounting position within the mounting channel.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1A:
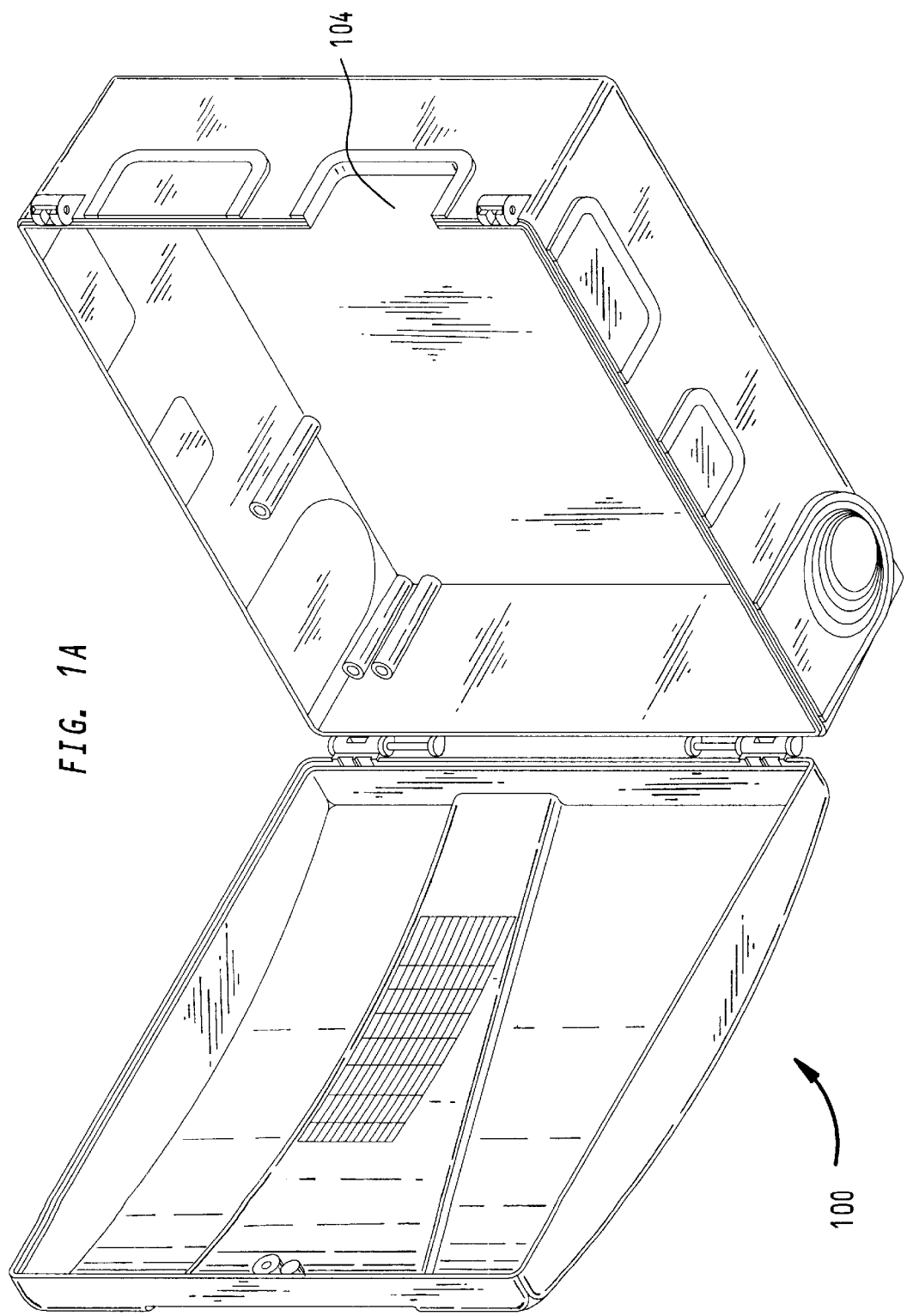
FIGS. 1A and 1B show a conventional building entrance protector and a wire trough, respectively, that can be configured to assist in the organization and bundling of wiring terminated at the BEP.
Figure 1B:
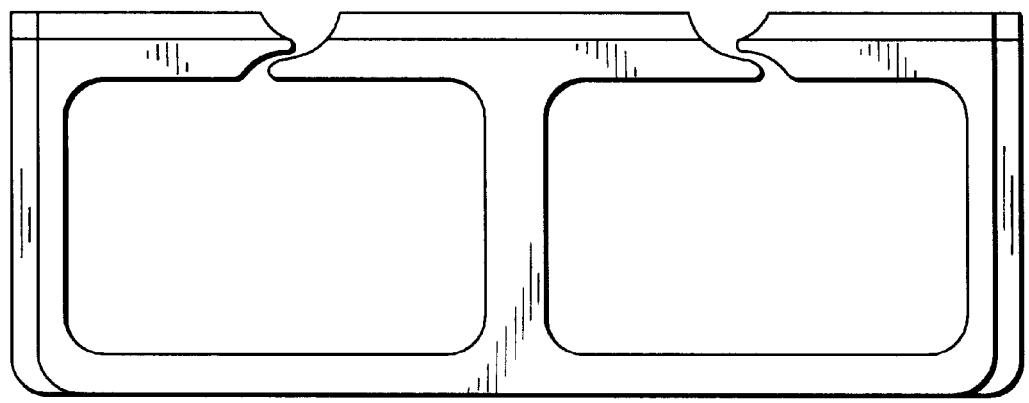
Figure 2A:
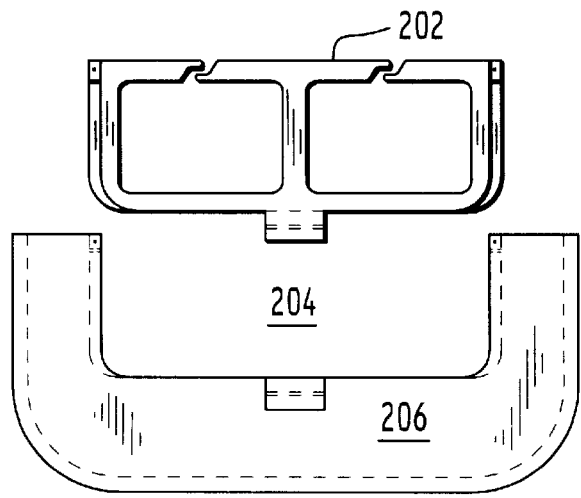
FIGS. 2A–C show three views of a wire trough and a mounting channel, which is part of a wall of an enclosure that may be similar in other respects to the building entrance protector of FIG. 1, according to one embodiment of the present invention.
Figure 2B:
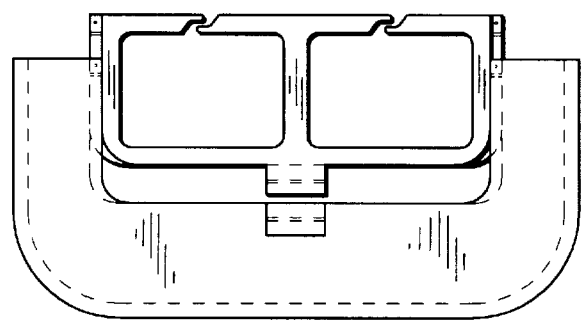
Figure 2C:
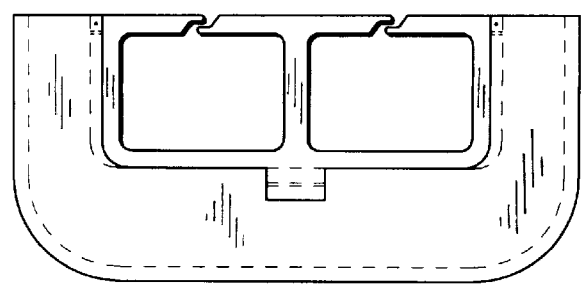

FIGS. 2A–C show three views of a wire trough 202 and a mounting channel 204, which is part of a wall 206 of an enclosure that may be similar in other respects to building entrance protector 100 of FIG. 1, according to one embodiment of the present invention. FIG. 2A shows wire trough 202 completely removed from mounting channel 204; FIG. 2B shows wire trough 202 partially engaged within mounting channel 204; and FIG. 2C shows wire trough 202 completely engaged within mounting channel 204 at its "full mounted position." As described below, wire trough 202 and mounting channel 204 are designed with a number of corresponding features that enable wire trough 202 to be mounted within mounting channel 204 in a secure and reliable fashion that prevents inadvertent removal of the wire trough from the mounting channel, e.g., by applying tension to wires retained within the wire trough. Wire trough 202 is preferably made from a sturdy, yet elastically deformable insulating material, such as an appropriate plastic.

Figure 3A:
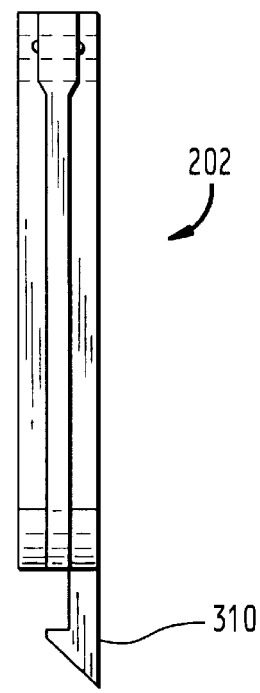
FIGS. 3A–C show cross-sectional views of the side, front, and top, respectively, of the wire trough of FIGS. 2A–C.
Figure 3B:
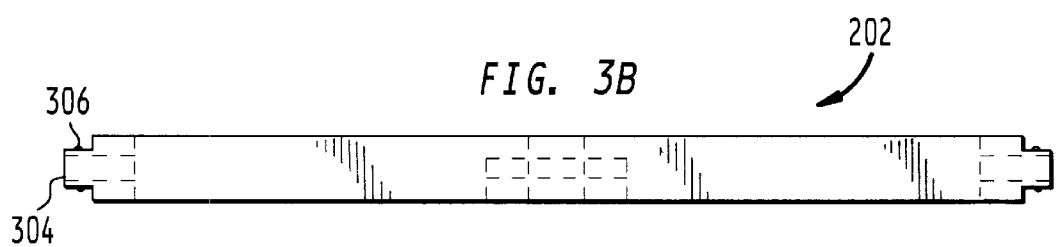
Figure 3C:
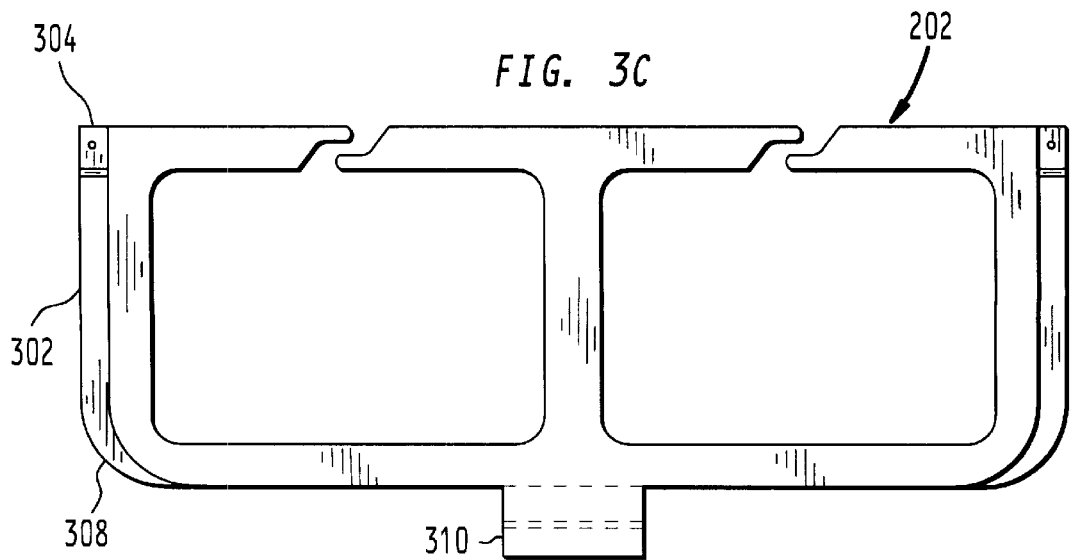
Figure 4A:
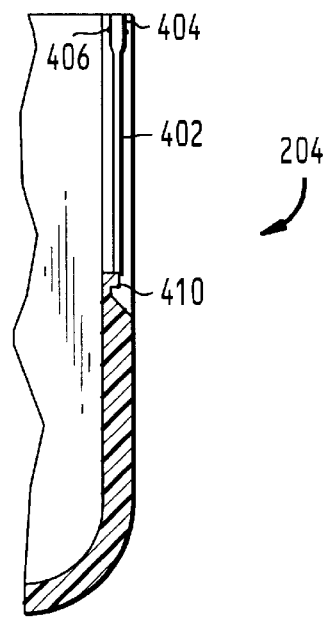
FIGS. 4A–C shows cross-sectional views of the side, front, and top, respectively, of the mounting channel of FIGS. 2A–C.
Figure 4B:
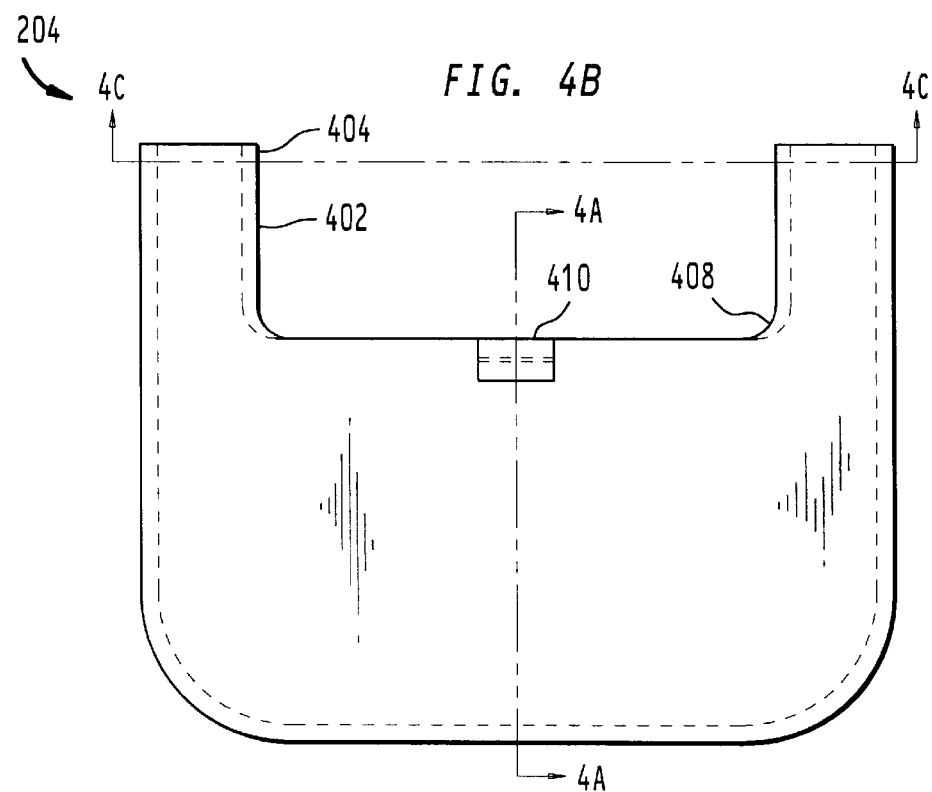
Figure 4C:
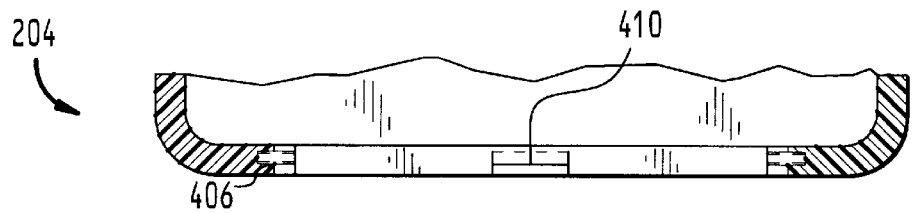

FIGS. 3A–C show cross-sectional views of the side, front, and top, respectively, of wire trough 202 of FIGS. 2A–C. Similarly, FIGS. 4A–C shows cross-sectional views of the side, front, and top, respectively, of mounting channel 204 of FIGS. 2A–C. Wire trough 202 has a lateral tongue 302 that is adapted to engage a lateral groove 402 in mounting channel 204 that allows wire trough 202 to be inserted within mounting channel 204. The upper part 304 of each lateral tongue 302 of wire trough 202 is thicker than its lower part and, similarly, the upper part 404 of each lateral groove 402 of mounting channel 204 is correspondingly wider that its lower part. In addition, the upper parts 304 and 404 have corresponding male and female dimples 306 and 406, respectively, on either side that engage one another at the full mounting position to provide some degree of resistance to removal of wire trough 202 from the full mounting position within mounting channel 204.

Wire trough 202 and mounting channel 204 have rounded lower corner s 308 and 408, respectively, that, along with the differential thicknesses and widths of the tongues and grooves mentioned earlier, make initial engagement of the tongue of the wire trough with the groove of the mounting channel relatively easy.

In addition, wire trough 202 and mounting channel 204 have male part 310 and female part 410, respectively, of a latch that engage one another to lock the wire trough at its full mounting position within the mounting channel. The latch is designed with a geometry that allows relatively easy insertion of the wire trough into the mounting channel while preventing inadvertent removal of the wire trough from its full mounting position. In particular, wire trough 202 and mounting channel 204 are configured such that a positive force needs to be applied to the wire trough from inside the enclosure and perpendicular to the enclosure wall in order to release or disengage the latch, while applying an upward force parallel to the enclosure wall to remove the wire trough from its full mounting position within the mounting channel. In fact, applying only an upward parallel force to the wire trough will further engage the latch thereby strengthening the retention feature. On the other hand, the male and female latch parts are designed with beveled ends that enable the wire trough to be moved to the full mounting position without having to directly apply a positive perpendicular force to the wire trough to engage the latch.

Figure 5A:
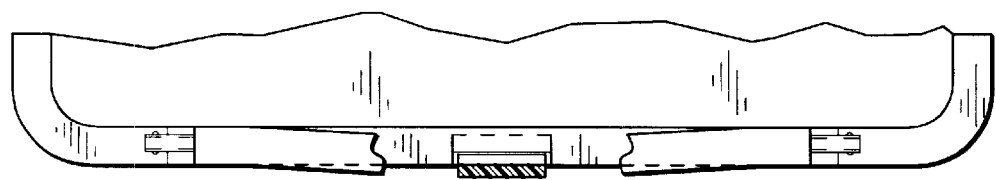
FIGS. 5A–B show cross-sectional top and side views of the wire trough and the mounting channel in the full mounting position of FIG. 2C with an appropriate force being applied at the lower center portion of the wire trough sufficient to release the latch.
Figure 5B:
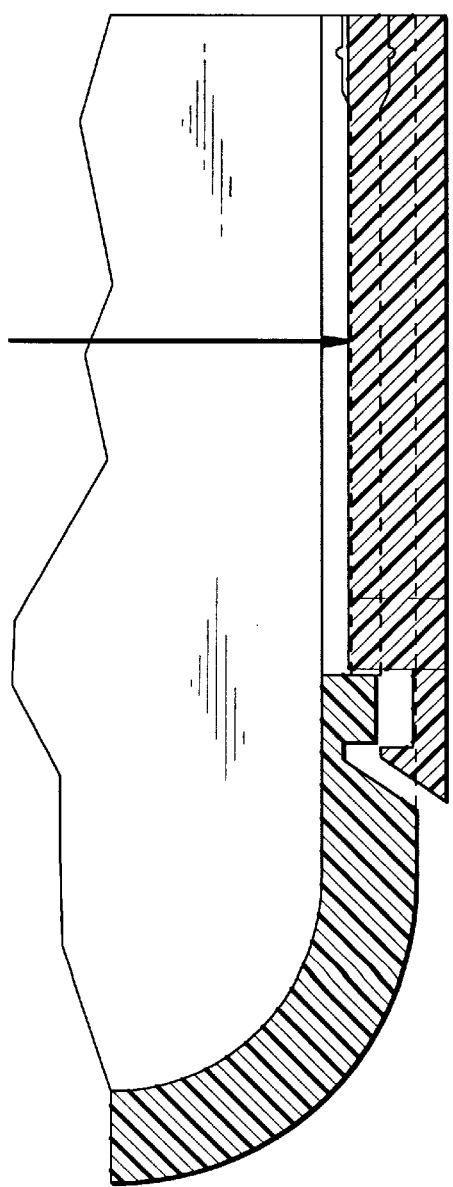

FIGS. 5A–B show cross-sectional top and side views of wire trough 202 and mounting channel 204 in the full mounting position of FIG. 2C with an appropriate perpendicular force being applied at the lower center portion of the wire trough sufficient to release the latch. Such a force cannot be applied by pulling on wires that are retained within wire trough 202. As such, the present invention provides a positive-retention wire trough that prevents such inadvertent removal of the wire trough from its full mounting position within a mounting channel.

Note that the tongue-and-groove arrangement of wire trough 202 and mounting channel 204 does not continue at their bottoms. This provides clearance for wire trough 202 to flex to allow engagement and disengagement of the latch.

Although the present invention has been described in the context of a latch in which the wire trough has the male part and the mounting channel has the female part, this arrangement may be reversed. Similarly, although the present invention has been described in the context of a latch that is disengaged by applying a positive perpendicular force from inside the enclosure, this arrangement too may be reversed such that the latch is disengaged by applying a positive perpendicular force from outside of the enclosure. It will be further understood that the present invention may be implemented using other types of latching configurations, which may or may not require positive perpendicular forces to be applied for disengagement.

Although the present invention has been described in the context of building entrance protectors for telecommunications equipment, those skilled in the art will understand that the present invention can be applied to other types of enclosures and wire boxes for telecommunications and other electrical equipment in which wires are to be terminated, including enclosures without lids.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A wire trough for slidably mounting within and along a mounting channel in a wall of an enclosure for electrical equipment, the wire trough adapted to retain wires passing through the mounting channel between the interior and the exterior of the enclosure, the wire trough comprising one half of a latch adapted to engage a corresponding half of the latch that is part of the mounting channel, wherein the latch is adapted to be disengaged by the application of a positive force to the wire trough perpendicular to the enclosure wall to flex the wire trough in order to remove the wire trough from a full mounting position within the mounting channel.

2. The invention of claim 1, wherein the wire trough comprises a male part of the latch adapted to engage a corresponding female part of the latch that is part of the mounting channel.

3. The invention of claim 1, wherein the positive force is applied to the wire trough from inside the enclosure.

4. The invention of claim 3, wherein the latch comprises structure that enables the wire trough to be moved to the full mounting position without having to directly apply a positive perpendicular force to the wire trough in order to engage the latch.

5. The invention of claim 1, wherein the wire trough has, on its lateral edges, one half of a tongue-and-groove arrangement adapted to engage a corresponding half of the tongue-and-groove arrangement that is part of the mounting channel.

6. The invention of claim 5, wherein the wire trough comprises a tongue of the tongue-and-groove arrangement adapted to engage a corresponding groove that is part of the mounting channel.

7. The invention of claim 5, wherein a top part of the tongue-and-groove arrangement is thicker and wider than a bottom part of the tongue-and-groove arrangement.

8. The invention of claim 5, wherein the tongue-and-groove arrangement has male protrusions and female dimples that engage one another when the wire trough is at the full mounting position within the mounting channel.

9. The invention of claim 5, wherein the tongue-and-groove arrangement does not extend along the bottom edge of the wire trough and the mounting channel to enable clearance for flexing the wire trough during engagement and disengagement of the latch.

10. The invention of claim 1, wherein the wire trough has rounded lower corners adapted to engage rounded lower corners of the mounting channel.

11. The invention of claim 1, wherein:
the wire trough comprises a male part of the latch adapted to engage a corresponding female part of the latch that is part of the mounting channel;
the positive force is applied to the wire trough from inside the enclosure;
the latch comprises structure that enables the wire trough to be moved to the full mounting position without having to directly apply a positive perpendicular force to the wire trough in order to engage the latch;
the wire trough has, on its lateral edges, a tongue of a tongue-and-groove arrangement adapted to engage a corresponding groove of the tongue-and-groove arrangement that is part of the mounting channel;
a top part of the tongue-and-groove arrangement is thicker and wider than a bottom part of the tongue-and-groove arrangement;

the top part of the tongue-and-groove arrangement has male protrusions and female dimples that engage one another when the wire trough is at the full mounting position within the mounting channel;

the tongue-and-groove arrangement does not extend along the bottom edge of the wire trough and the mounting channel to enable clearance for flexing the wire trough during engagement and disengagement of the latch; and the wire trough has rounded lower corners adapted to engage rounded lower corners of the mounting channel.

12. An enclosure for electrical equipment, the enclosure having a mounting channel in a wall of the enclosure and a wire trough adapted to be slidably mounted within and along the mounting channel to retain wires passing through the mounting channel between the interior and the exterior of the enclosure, the wire trough comprising one half of a latch adapted to engage a corresponding half of the latch that is part of the mounting channel, wherein the latch is adapted to be disengaged by the application of a positive force to the wire trough perpendicular to the enclosure wall to flex the wire trough in order to remove the wire trough from a full mounting position within the mounting channel.

13. The invention of claim 12, wherein the wire trough comprises a male part of the latch and a corresponding female part of the latch is part of the mounting channel.

14. The invention of claim 12, wherein the positive force is applied to the wire trough from inside the enclosure.

15. The invention of claim 12, wherein the latch comprises structure that enables the wire trough to be moved to the full mounting position without having to directly apply a positive perpendicular force to the wire trough in order to engage the latch.

16. The invention of claim 12, wherein the wire trough has, on its lateral edges, one half of a tongue-and-groove arrangement adapted to engage a corresponding half of the tongue-and-groove arrangement that is part of the mounting channel.

17. The invention of claim 16, wherein the wire trough comprises a tongue of the tongue-and-groove arrangement and a corresponding groove is part of the mounting channel.

18. The invention of claim 16, wherein a top part of the tongue-and-groove arrangement is thicker and wider than a bottom part of the tongue-and-groove arrangement.

19. The invention of claim 16, wherein the tongue-and-groove arrangement has male protrusions and female dimples that engage one another when the wire trough is at the full mounting position within the mounting channel.

20. The invention of claim 16, wherein the tongue-and-groove arrangement does not extend along the bottom edge of the wire trough and the mounting channel to enable clearance for flexing the wire trough during engagement and disengagement of the latch.

21. The invention of claim 12, wherein the wire trough and mounting channel have rounded lower corners.

22. The invention of claim 12, wherein:

the wire trough comprises a male part of the latch and a corresponding female part of the latch is part of the mounting channel;

the positive force is applied to the wire trough from inside the enclosure;

the latch comprises structure that enables the wire trough to be moved to the full mounting position without having to directly apply a positive perpendicular force to the wire trough in order to engage the latch;

the wire trough has, on its lateral edges, a tongue of a tongue-and-groove arrangement adapted to engage a corresponding groove of the tongue-and-groove arrangement that is part of the mounting channel;

a top part of the tongue-and-groove arrangement is thicker and wider than a bottom part of the tongue-and-groove arrangement;

the top part of the tongue-and-groove arrangement has male protrusions and female dimples that engage one another when the wire trough is at the full mounting position within the mounting channel;

the tongue-and-groove arrangement does not extend along the bottom edge of the wire trough and the mounting channel to enable clearance for flexing the wire trough during engagement and disengagement of the latch; and the wire trough and mounting channel have rounded lower corners.

* * * * *